(12) United States Patent
Quincy et al.

(10) Patent No.: US 7,499,845 B1
(45) Date of Patent: Mar. 3, 2009

(54) FASTENER TIGHTENING ANALYSIS

(75) Inventors: Jean-Baptiste Quincy, Paris (FR); Emmanuel Savinien, Paris (FR); Charles-Andre DeHillerin, St. Cloud (FR); Christian Naveau, Sannois (FR)

(73) Assignee: Dassault Systemes (FR)

( * ) Notice: Subject to any disclaimer, the term of this patent is extended or adjusted under 35 U.S.C. 154(b) by 469 days.

(21) Appl. No.: 10/094,416

(22) Filed: Mar. 8, 2002

(51) Int. Cl.
*G06G 7/48* (2006.01)

(52) U.S. Cl. .......................................................... 703/7
(58) Field of Classification Search ...................... 703/7; 411/427, 383
See application file for complete search history.

(56) References Cited

U.S. PATENT DOCUMENTS

| | | | | |
|---|---|---|---|---|
| 5,920,491 A | * | 7/1999 | Hibbitt et al. | 703/7 |
| 6,904,395 B1 | * | 6/2005 | DeJack et al. | 703/7 |

OTHER PUBLICATIONS

Ansys, Inc.; "Structural Analysis Guide Release 5.5", 1998, http://euler.cesup.ufrgs.br/ansys/guide_55/g-str/gstrrev.htm.*
Ansys, Inc.; "Modeling and Meshing Guide Release 5.5", 1998, http://euler.cesup.ufrgs.br/ansys/guide_55/g-str/gmodrev.htm.*
Lin, Qing; Steven, Grant P.; "Evolutionary structural optimization for connection topology design of multi-component systems", 2001, in Engineering Computations, vol. 18, Issue 3/4.*
"Ansys Theory Reference Release 5.6", 1999, Ansys Inc.*
Jerome Montgomery, "Methods for Modeling Bolted Joint", Apr. 2002, ANSYS Users Conference, 15 unnumbered pages.*
Alexander Rutman et al., "Fasteners Modeling for MCS.Nastran Finite Element Analysis", Oct. 12, 2000, American Institute of Aeronautics, pp. 1-18.*

* cited by examiner

*Primary Examiner*—Paul L Rodriguez
*Assistant Examiner*—Russ Guill
(74) *Attorney, Agent, or Firm*—Isabel Cantallops; Clifford Chance US LLP

(57) ABSTRACT

Analyzing the mechanical state of an assembly modeled by a computer aided design system includes generating a model of a fastener and a part of the assembly. The fastener model includes an engaging region and the part model includes a receiving region to fastenably receive the engaging region. The fastener and the part are each represented by finite element representations that include elastically interconnected nodes. A tightening mesh interconnecting nodes of the engaging region and nodes of the receiving region is generated and a force applied between the nodes of the engaging and receiving region is determined based on a pre-tension force occurring upon engaging the engaging region with the receiving region.

18 Claims, 10 Drawing Sheets

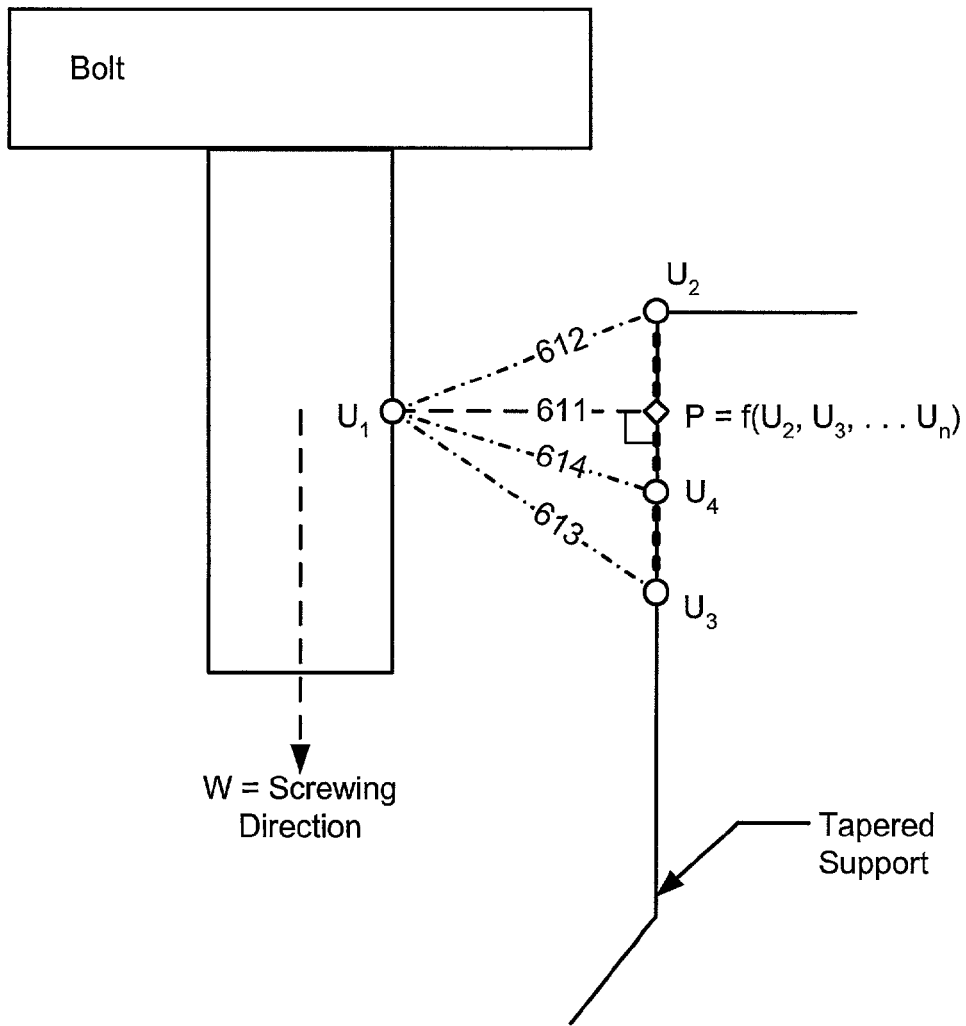
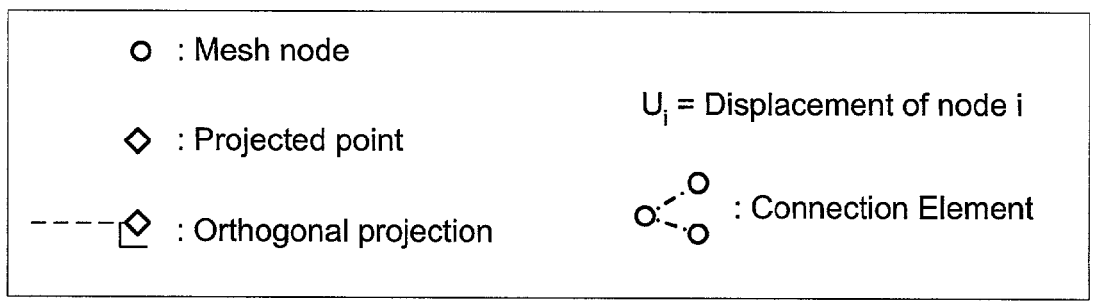
Fig. 6C

Contribution of a 4-node tightening element (node 1 is projected node) to matrices $\tilde{A}_{TE}$ and $\tilde{A}_{TI}$

| | $T_{1x}$ | $T_{1y}$ | $T_{1z}$ | $T_{2x}$ | $T_{2y}$ | $T_{2z}$ | $T_{3x}$ | $T_{3y}$ | $T_{3z}$ | $T_{4x}$ | $T_{4y}$ | $T_{4z}$ | | |
|---|---|---|---|---|---|---|---|---|---|---|---|---|---|---|
| first row in $\tilde{A}_{TE}$: | $-u_x$ | $-u_y$ | $-u_z$ | $C_{2x}*u_x$ | $C_{2y}*u_y$ | $C_{2z}*u_z$ | $C_{3x}*u_x$ | $C_{3y}*u_y$ | $C_{3z}*u_z$ | $C_{4x}*u_x$ | $C_{4y}*u_y$ | $C_{4z}*u_z$ | = | 0 |
| second row in $\tilde{A}_{TE}$: | $-v_x$ | $-v_y$ | $-v_z$ | $C_{2x}*v_x$ | $C_{2y}*v_y$ | $C_{2z}*v_z$ | $C_{3x}*v_x$ | $C_{3y}*v_y$ | $C_{3z}*v_z$ | $C_{4x}*v_x$ | $C_{4y}*v_y$ | $C_{4z}*v_z$ | = | 0 |

| | $T_{1x}$ | $T_{1y}$ | $T_{1z}$ | $T_{2x}$ | $T_{2y}$ | $T_{2z}$ | $T_{3x}$ | $T_{3y}$ | $T_{3z}$ | $T_{4x}$ | $T_{4y}$ | $T_{4z}$ | | |
|---|---|---|---|---|---|---|---|---|---|---|---|---|---|---|
| row in $\tilde{A}_{TI}$: | $-w_x$ | $-w_y$ | $-w_z$ | $C_{2x}*w_x$ | $C_{2y}*w_y$ | $C_{2z}*w_z$ | $C_{3x}*w_x$ | $C_{3y}*w_y$ | $C_{3z}*w_z$ | $C_{4x}*w_x$ | $C_{4y}*w_y$ | $C_{4z}*w_z$ | less than | R |

Fig. 7

FASTENER TIGHTENING ANALYSIS

BACKGROUND OF THE INVENTION

In designing mechanical part assemblies using computer aided design, manufacturing, and engineering (CAD/CAM/CAE) systems, it is useful to simulate and analyze the structural behavior of an assembly under operating conditions and the stresses experienced by the assembly under those operating conditions. Stress simulation and analysis operations are usually based on a geometrical discretization of the assembly using a finite element mesh representation of each part body in the assembly. Each mesh is usually comprised of nodes and elements interconnecting the nodes. These nodes and elements may take the form of solid elements such as tetrahedrons, hexahedrons, cubes, etc, surface elements such as triangles, quadrangles, and so-called 1-D elements such as bars and interconnecting links. Techniques for constructing such nodes and elements are described in, e.g., *The Finite Element Method* by O. C. Zienkiewicz and R. L. Taylor, McGraw Hill, 1989 [ref. 1], and *The Finite Element Method* by T. J. R. Hughes, Prentice-Hall, 1987 [ref. 2].

Existing stress analysis systems can work well with simple connections such as contact or fastened connections. However, more complex connections may not be dealt with in a fully satisfactory manner. One classical example of a complex connection is the tightening of a bolt in an assembly. The tightening of a bolt involves the application of a force, usually called a pre-tension force, that comes into play before other working loads. In some cases, CAD/CAM stress analysis systems ignore the complexity of such connections, or approximate them by treating them similarly to fastened connections. New systems and techniques for analyzing bolt and other pre-tensioned connections are to enable design engineers to better analyze assemblies of parts.

SUMMARY OF THE INVENTION

Analyzing the mechanical state of an assembly modeled by a computer aided design system includes generating a model of a fastener and a part of the assembly. The fastener model includes an engaging region and the part model includes a receiving region to fastenably receive the engaging region. The fastener and the part are each represented by finite element representations that include elastically interconnected nodes. A tightening mesh interconnecting nodes of the engaging region and nodes of the receiving region is generated and a force applied between the nodes of the engaging and receiving region is determined based on a pre-tension force occurring upon engaging the engaging region with the receiving region.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 6A-C illustrate meshing of an assembly.
FIG. 7 shows coefficient matrices.

DETAILED DESCRIPTION OF THE INVENTION

Figure 1:
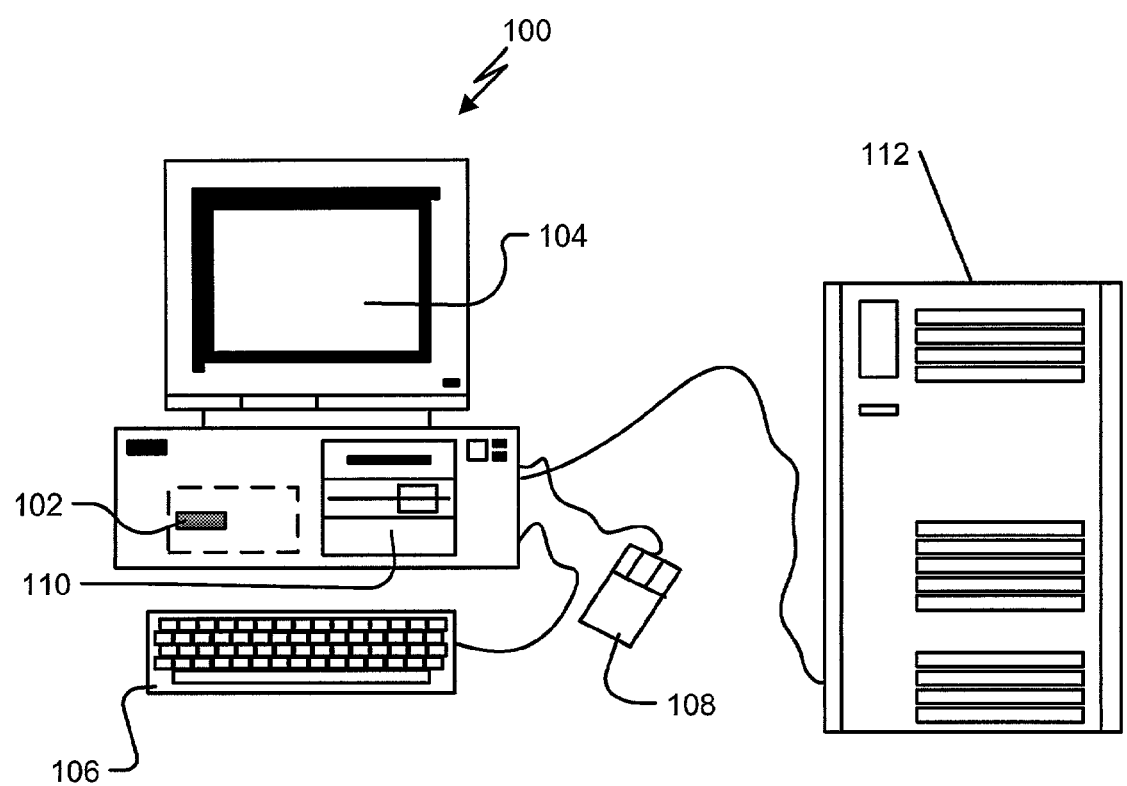
FIG. 1 is a system diagram.

FIG. 1 shows a computerized modeling system 100 that includes a CPU 102, a CRT 104, a keyboard input device 106, a mouse input device 108, and a storage device 110. The CPU 102, CRT 104, keyboard 106, mouse 108, and storage device 110 can include commonly available computer hardware devices. For example, the CPU 102 can include a Pentium-based processor. The mouse 108 may have conventional left and right buttons that the user may press to issue a command to a software program being executed by the CPU 102. Other computer hardware platforms are suitable as will become apparent from the discussion that follows. Such computer hardware platforms are preferably capable of operating the Microsoft Windows NT, Windows 95, Windows 98, Windows 2000, or UNIX operating systems.

Computer-aided design software is stored on the storage device 110 and is loaded into and executed by the CPU 102. The software allows the design engineer to create and modify a three dimensional (3D) model and implements aspects of the invention described herein. The CPU 102 uses the CRT 104 to display a 3D model and other aspects thereof as described later in more detail. Using the keyboard 106 and the mouse 108, a design engineer can enter and modify data for the 3D model. The CPU 102 accepts and processes input from the keyboard 106 and mouse 108. The CPU 102 processes the input along with the data associated with the 3D model and makes corresponding and appropriate changes to that which is displayed on the CRT 104 as commanded by the modeling software. Additional hardware devices may be included in the computerized modeling system 100, such as video and printer devices. Furthermore, the computerized modeling system 100 may include network hardware and software thereby enabling communication to a hardware platform 112.

The system 100 includes CAD/CAM software with improved analysis functionality integrating a stress analysis process for pre-tensioned fasteners as part of an overall design and analysis process. In some implementations, the stress analysis capabilities may be conducted in close relationship with design of the actual geometry of an assembly using a process that is both generative and associative. That is a user may modify the design of the assembly and automatically receive stress and other analysis results (a "generative" process), thereby increasing user productivity. Further, the finite element objects generated by the system 100 can be strongly associated with model geometry, e.g. the system can retrieve and update all the elements representing a part, as well as all the element faces representing a part's surface (an "associative" feature of the system).

In the implementation that follows, these analysis capabilities are described for one class of pre-tensioned fasteners, in particular, for bolted connections. The techniques described herein may be extended to other classes of fasteners (e.g., riveted connections). Generally speaking, the processes for such stress analysis include structural analysis, preparing the modeled assemblies, determining analysis connections, mesh generation, bolt tightening connection mesh generation, and analysis (including determining bolt tightening connection properties and computing equality and inequality constraints). Each of these processes will now be described.

Structural Analysis of Assemblies

Stress analysis and simulation features in a CAD/CAM/CAE system can include processes to analyze stresses attributed to the interconnection of parts using connectors applying a pre-tension force, such as bolts and rivets. This stress analysis process can produce an analysis based on a simulation using meshes representing the component parts in the assembly, contact connections between the component parts, and tightening meshes for pre-tensioned fasteners (e.g., bolts). One of the output of this analysis are stress forces in the meshes of the component parts. The stress analysis takes into account the material properties of the component parts and the various loads and restraints applied to the parts, and, using the mesh representations, computes the stresses induced in the assembly by the bolt (or other pre-tensioning connector). Once computed, the stresses induced in an assembly may be represented as Von Mises (scalar measure of the stress). In a Von Mises representation, the stresses induced in an assembly or its component parts are presented using different colors to represent different stress levels (computed stresses may also be used for purposes other than the generation of Von Mises displays, e.g., as tensor component values used for other CAD/CAM/CAE system calculations).

Figure 2:
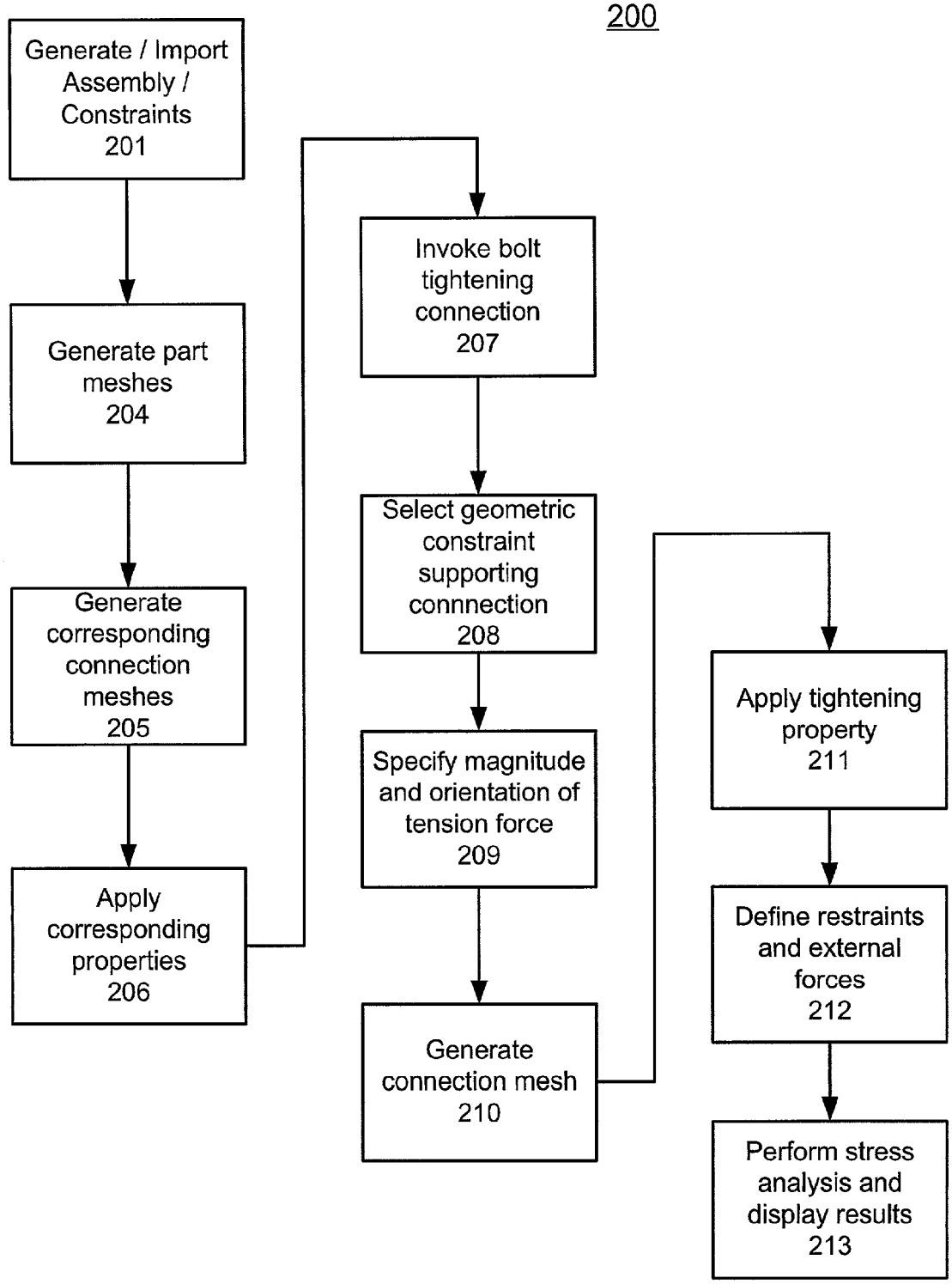
FIG. 2 is a flowchart of a stress analysis process

Known stress analysis techniques compute stress using an elastic mesh representation of each part of an assembly. This elastic mesh representation includes linked nodes at the surface as well throughout the internal region of each modeled part. To model stress, displacements at the nodes of the elastic mesh representation are computed. Further, reaction forces transmitted between parts by simple coupling arrangements (e.g., contact between parts) can be computed by linking together nodal displacement of coupled parts. However, such simple coupling techniques may not adequately model reaction forces between fasteners and parts (e.g., between a bolt and the threaded surface receiving the bolt). FIG. 2 shows, in flowchart form, a process that may be used to more accurately model stress forces resulting from such pre-tensioned fasteners. As disclosed herein, the process of FIG. 2, may be used to calculate stress forces exerted at nodes on a bolt's threaded surface and at nodes on the threaded receiving surface. Once these bolt tightening stress forces are determined, conventional techniques for propagating these forces throughout the nodes of the affected part can be used to determine the stress effects throughout a modeled part.

As shown in FIG. 2, prior to performing stress analysis, an assembly is generated (or, alternatively, a previously generated assembly is imported into the stress analysis system) (step 201). The assembly models at least a portion of an object being designed. Implementations may use different CAD/CAM tools and techniques to construct an assembly. These techniques include solid modeling, wire-frame modeling, and surface modeling. Solid modeling techniques provide for topological 3D models, where the 3D model is a collection of interconnected edges and faces. Wire-frame modeling techniques, on the other hand, can be used to represent a model as a collection of simple 3D lines, whereas surface modeling can be used to represent a model as a collection of exterior surfaces. CAD/CAM systems may combine these, and other, modeling techniques, such as parametric modeling techniques to produce an assembly and specify constraints governing the interconnection of parts in the assembly. Techniques for producing such models are implemented by a variety of software products including, e.g., the CATIA V5 CAD/CAM system from Dassault Systémes.

Preparing the Geometric Assembly

Figure 3A:
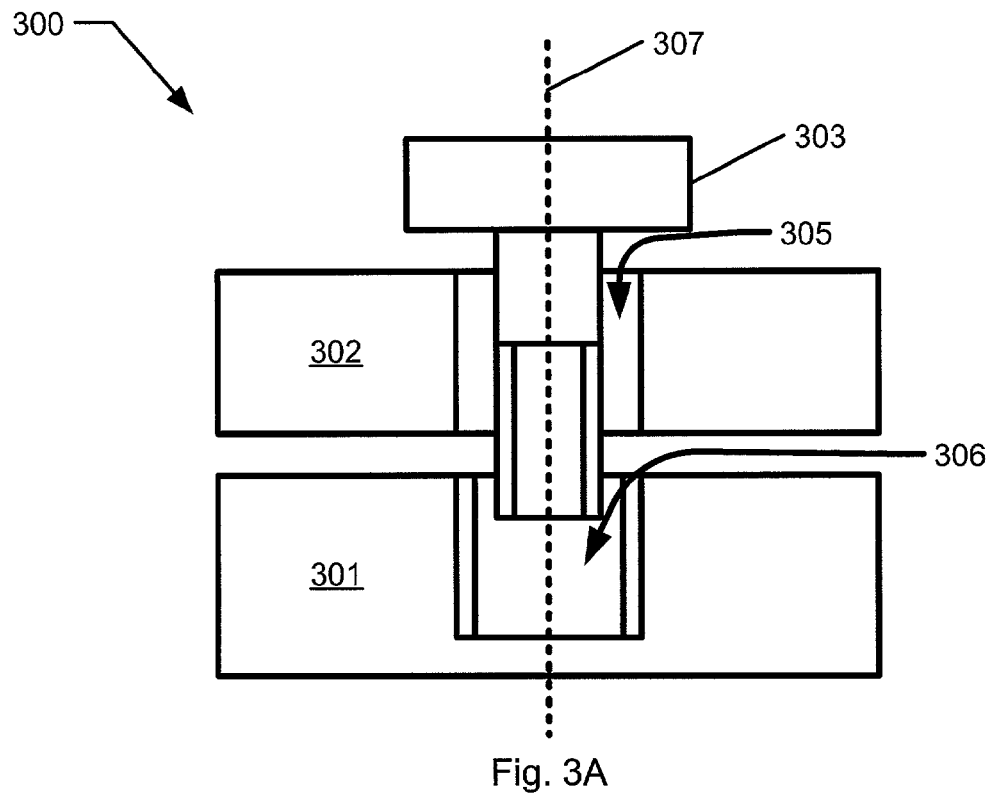
FIGS. 3A and 3B show an assembly.
Figure 3B:
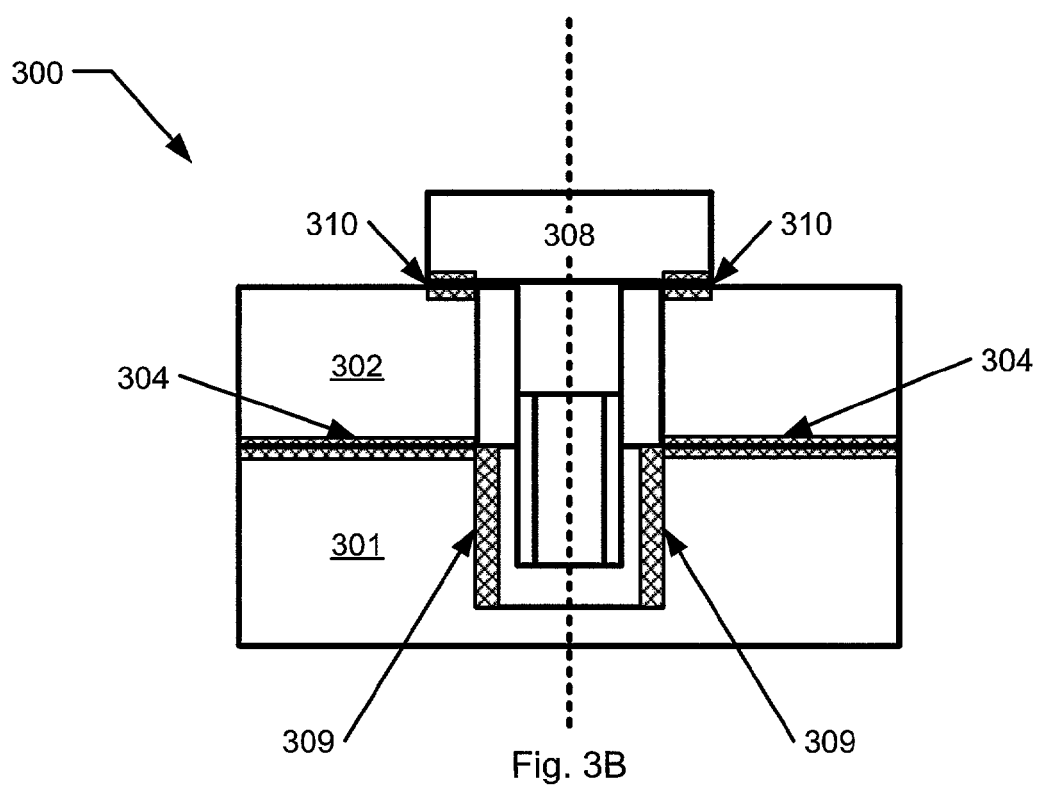

Generally speaking, generating an assembly includes defining component parts of the assembly as well as geometric constraints associated with those parts and the types of connections between parts. The generation of the assembly (step 201) can be done using conventional CAD/CAM systems and tools. FIGS. 3A and 3B show a simple example of a generated assembly 300. The assembly 300 includes three parts: a pad 301 with a partially threaded hole 306, a pad 302 with an unthreaded thru-hole 305, and a bolt 303. Specifying geometric constraints may include specifying (i) that parts 301-302 are adjacent along a given (functional) surface 304, (ii) that their holes 305-306 are in a coaxial arrangement, (iii) that the axis of the bolt coincides with a common axis 307 of the holes, (iv) and that the head 308 of the bolt 308 sits on one surface part 302. The constraints may be specified during the design of an assembly or, in some implementations, at a separate stage of modeling and analysis. A CAD/CAM stress analysis system may also include functionality to modify previously specified geometric constraints or to add geometric constraints to an imported object models/assemblies (e.g., if the originating application did not include appropriate geometric constraints specification features).

Geometric constraints may be explicitly specified by a user while an assembly is being designed or may be implicit in the design of an assembly (i.e., constraints inferred by the CAD/CAM system based on the structure of parts and the assembly). Further, each component part 301-303 is defined not only by its geometrical characteristics but also by other characteristics, including the material of which the part is made, e.g. steel. These additional characteristics may be obtained from a database of known material characteristics automatically accessed by the CAD/CAM system, or may be explicitly input using features of the CAD/CAM system. CAD/CAM system databases may also include libraries of pre-existing parts and assemblies along with their relevant constraints.

Analysis connection supports between parts can also be specified during the assembly generation process. If the assembly was imported from another application, or additional constraints are to be specified, the analysis connection supports and geometric constraints may also be specified or refined as a separate process following step 201. For the analyst, geometric constraints and analysis connection supports function as a mechanism to select two surfaces on which the analysis connection should apply. In other implementations, the analysis connections could as well directly use two surfaces without the need of a geometrical constraint or an analysis connection support.

Analysis Connections

Figure 4:
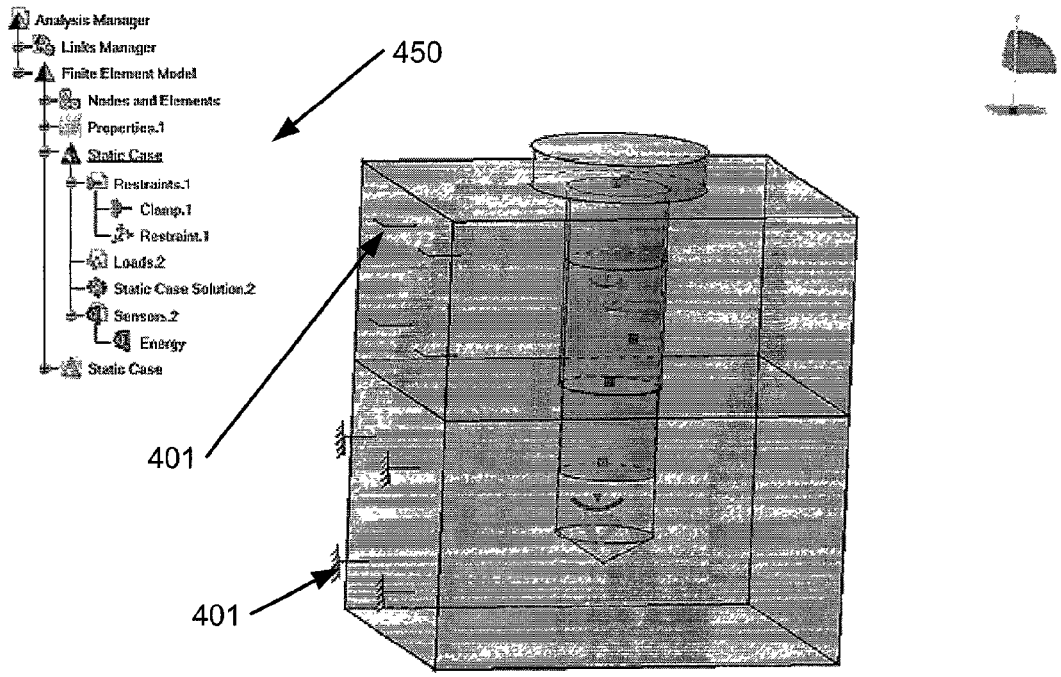
FIGS. 4 and 5 show user interface displays.

The analysis connections types characterize the interactions between the parts (contact connection, fastened connection and so forth). For example, a user can specify that (i) a contact connection exists between parts 301 and 302 along surface region 304, (ii) the head 308 of the bolt 303 contacts the pad 302 in the region 310, and (iii) a tightening connections exists between the bolt 303 and part 302 in the threaded region 309. Implementations may also support other types of connections, as well as the traditional loads or restraints. FIG. 4 shows examples of such restraints. For example, restraining clamps 401 on the bottom side of the lower box, and other restraints 402 on the left side of the top box. Generally speaking, a "restraint" 401, 402 models a fastening system or force preventing translation or rotation of a restrained surface, edge or vertex. Typical restraints limit translation or rotation in one, two or three dimensions (depending on the restraint type). Example restraints include clamps, pivots, ball-joints and others.

During the construction process (step 201), each geometric constraint and analysis connection may be displayed on a computer display with a specific symbol indicating the constraint. This symbolic representation of geometric constraints may be displayed in close vicinity to the position of the true mechanical constraint (for example, at the centre of the common face for the two adjacent parts). In addition, these geometrical constraints and other types of analysis connection supports may be listed in a 'Specification Tree', which is an alternate view of the model that provides a hierarchical view of interconnected parts and specified constraints of a model. A specification tree can be seen as 450 of FIG. 4. A user can define the required connections between parts by selecting the relevant parts (e.g., by clicking on corresponding part locations in the 3D view of FIG. 4 or by making selections in the specification tree 450), and the selecting the type of connection or constraint (e.g. by clicking on an icon in a toolbar or by selecting a menu item). These selection and specification steps are generic, and other types of selection processes can be used (e.g., part codes, keystroke selections, clicking on icons, etc.).

After the assembly 300 is constructed and its characteristics are specified, stress analysis can be performed. During stress analysis (steps 204-213), implementations may calculate the degrees of freedom (i.e. the nodal displacement) of the meshed assembly when that assembly is in operation. The stresses are then obtained by post processing the degrees of freedom using, e.g., procedures detailed in [ref. 1]. Preferably, the stress analysis will consider all relevant assembly characteristics (including, e.g., the types of loads experienced by the parts and assembly, restraints applied to the parts, and the analysis connections between the various part). The stress analysis process 204-213 will also consider material and mechanical properties other than the user-specified constraints. For example, characteristics of the material that each part is composed of will affect the strain calculations (e.g., hardness, brittleness, elasticity). Material properties can be defined by parameters such as the Young Modulus, the Poisson Ratio, the Density, and, from a general standpoint, any parameter which characterizes the mechanical behavior of the related part. In some embodiments, the user may apply these properties as a whole by choosing a material related to the part (such as "steel", "aluminum", and so forth), and the system retrieves the corresponding parameters from a database. The material that the part is composed of may be specified during the design of a part or may be obtained from a reference a database of materials and parts. For example, if a user selects a bolt from a standard library of bolt parts, the system may automatically obtain characteristics of the bolts material and construction.

Mesh Generation

Figure 3C:
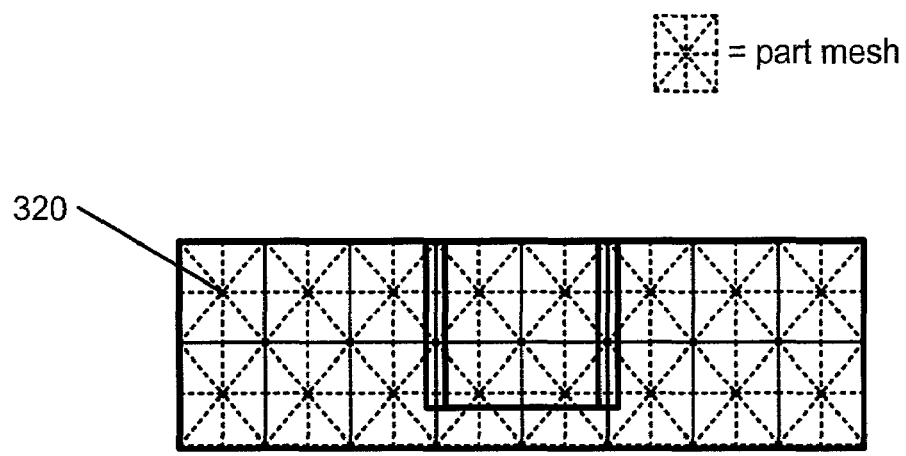
FIG. 3C is a part mesh used to model stress forces affecting a part.
Figure 3D:
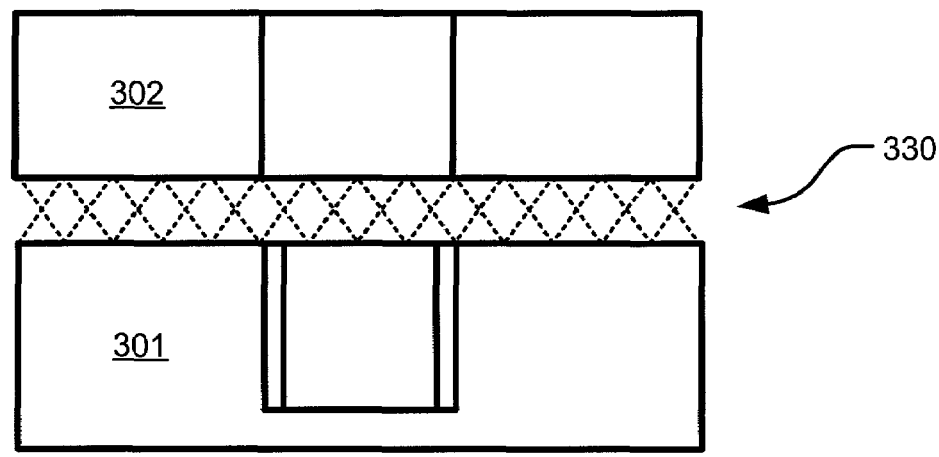
FIG. 3D shows an example of a connection mesh.

To model stress effects within a part, and reaction forces between parts due to the mechanical relationships between parts, the system generates part meshes (step 204) and connection meshes interconnecting pairs of part meshes to each other (step 205). Part and connection meshes are finite element models composed of a set of interconnected nodes. These nodes are located on the surface of each part as well as throughout the interior of each solid part. Each node supports degrees of freedom determining its displacement. The part meshes are used to model stress forces within a particular part. For example, referring to FIG. 3C, a part mesh 320 (shown as dashed lines overlaid on part 301) is used to model stress forces affecting part 301. Connection meshes are used by the system to characterize and model interactions between meshed parts. Further, in the context of bolt-tightening analysis, some implementations can automatically generate and use meshes without requiring manual user operation (such as surface designation, or part nodes or elements identification). The system's use of meshes between surfaces differs from mesh applications in which meshes are used to simulate the elasticity of parts. Of course, in some implementations, the mesh generation steps may be less automated (e.g., the steps may involve additional user interaction and confirmation displays). Connection meshes are used to model displacement and/or reaction force couplings between interconnected parts. FIG. 3D shows an example of a connection mesh 330. Part meshes may be automatically generated by the system as each part is added to the assembly (i.e., during step 201) or as separate steps 204 when the user calls the stress analysis workbench with respect to a particular geometrical assembly. Connection meshes can be generated after the connections between parts have been defined by a user in step 201 or as a separate step 205.

Figure 5:
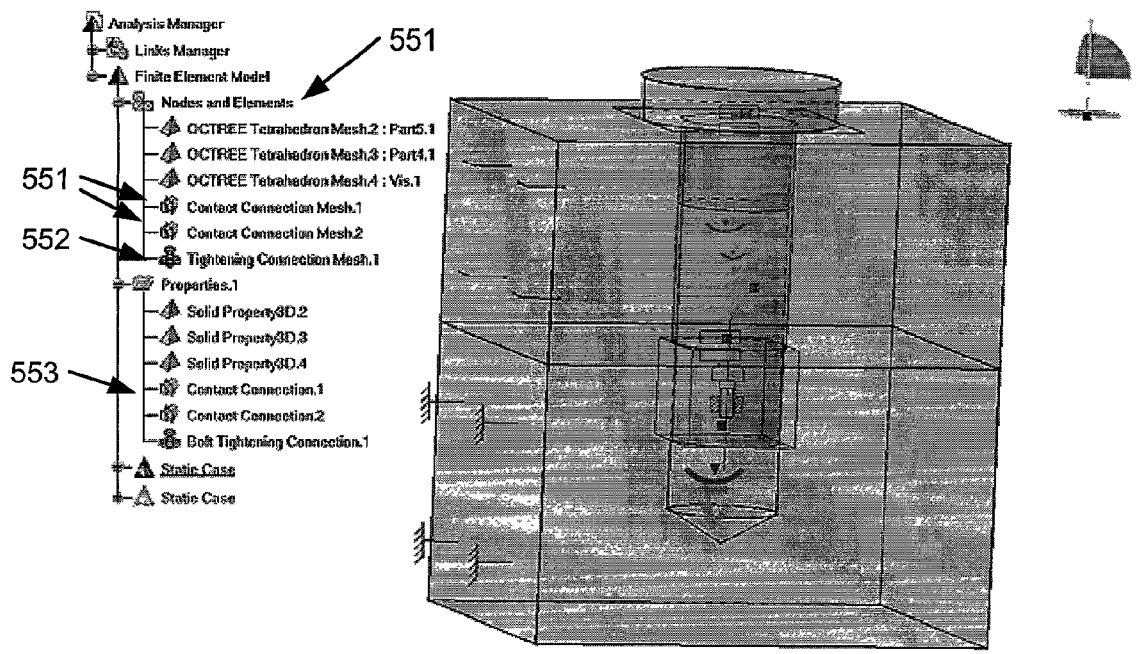

In some implementations, connection meshes may be shown as a sub-branch of the "Nodes and Elements" features group 550 in the feature specification tree of the FIG. 2. A connection mesh 551, 330 can link surfaces of parts 301-302 that are connected through contact connection 304 and a tightening connection mesh 552 can link surfaces of parts 308, 301 that are connected through a bolt tightening connection 309. The connection meshes are used by the system at step 213 to generate relationships between the degrees of freedom of the nodes of the two meshed surfaces. By "meshed surface" it is meant the set of element faces and nodes of the part mesh associated with the surface of part. In some implementations, connection meshes can be characterized by a type (such as contact, tightening, fastened, and so forth). Associating a type with the connection mesh provides additional detail about the relationships between the parts and the relationships governing the degrees of freedom of the nodes of the two meshed surfaces involved in the connection. Additional parameters, such as local normal directions for a sliding contact, or a tightening force, may also be specified. In a preferred embodiment, these additional parameters are grouped under a connection property. Connection properties are shown in a sub-branch of the "Properties.1" features group 553 in the feature specification tree of the FIG. 5. Techniques used to mesh individual parts can be applied to the generation of connection meshes between parts, although in many cases theses techniques differ, as seen with the generation of the bolt tightening mesh.

Bolt Tightening Connection Mesh

To analyze bolt tightened assemblies, the system generates a particular type of connection mesh referred to herein as a "bolt tightening connection mesh." A bolt tightening connection mesh enables modeling of the effects of pre-tension forces attributed to bolt tightness. These effects are analyzed based on user-specified characteristics of the tightened bolt connection. One such characteristic is the pre-tension force of the bolt. This pre-tension force is related to the tightness of the bolt. Implementations may specify this force using a CAD/CAM system tool to "screw" the bolt and thereby tighten the connection between parts (step 207). The tightening of the bolt creates a pre-tension force separate from the loads that may be applied to the assembly. To tighten the connection, the user selects the geometrical assembly or analysis connection support involving the two coincident threaded surfaces. For example, in an example implementations, the user selects a bolt tightening connection tool by clicking on a corresponding icon. The user then provides an indication of the magnitude and of the orientation of the pre-tension force to be applied on the bolt thread. It is noted that the system, as described below, will generate an opposite force on the hole thread thus equilibrating the pre-tension force applied on the bolt thread. Typically, the orientation is such that the pre-tension force tends to bring together the support and the bolt head, but it may happen that the user wishes this direction to be in the opposite sense (that is to say that the intent of the user is for the tightening to push the support away from the head of the bolt, instead of towards it).

Figure 6A:
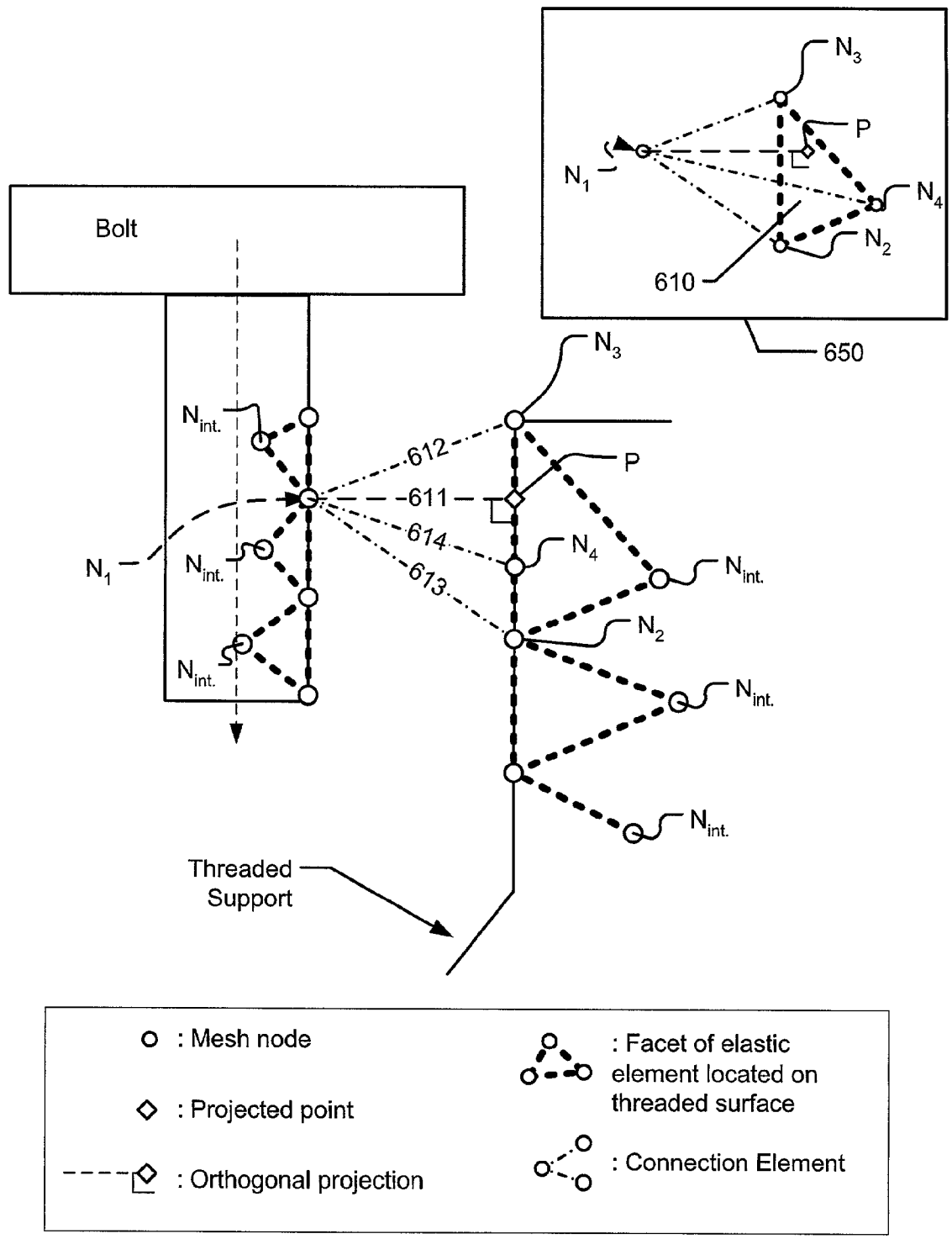

FIG. 6A shows an element of a bolt tightening mesh as a set of connection links 612-614 coupling a node ($N_1$) of the meshed threaded surface of the bolt to nodes ($N_2$, $N_3$, $N_4$) of the meshed threaded surface of the tapered hole. It is noted that nodes $N_2$, $N_3$, $N_4$ are nodes of a triangular element of the threaded surface; however, in the perspective view of FIG. 6A, these nodes appear as if on a straight line. For clarity, inset 650 shows an off-axis view of the nodes $N_2$, $N_3$, $N_4$ showing the triangular element 610 bounded by the nodes $N_2$, $N_3$, $N_4$. Also shown are example interior nodes ("$N_{int.}$") of the parts; such interconnected interior nodes are present throughout the interior of each part. Other nodes of the thread area of the bolt's part mesh are similarly coupled to other nodes of the receiving thread area of the hole's part mesh (such links are not shown to maintain clarity of FIG. 6A). To form the bolt tightening mesh, the system first selects either the part mesh of the bolt threads or the part mesh of the threads of the hole and then performs orthogonal projections (e.g., 611) from the selected (bolt) mesh to the other (receiving hole) mesh. Preferably, the selected mesh will be the finer of the two meshes. Note that, even if the threads are represented in the CAD/CAM system model, it is not necessary to represent their true shapes in generating the connection mesh. That is, the threads may be considered as a flat surface, on both the bolt and the hole.

In the case of the bolt and hole (i.e., tapered support) of FIG. 6, the selected (i.e., finer) mesh is the bolt's part mesh. Each node of the selected mesh is then projected orthogonally from the selected mesh (i.e., the bolt's mesh) onto the surface of the other part involved in the connection (i.e., the threaded support). The use of an orthogonal projection restricts the generation of the bolt tightening connection mesh to the contact area between the bolt threads and the threaded receiving hole. For example, an orthogonal projection 611 from bolt node $N_1$ is orthogonally projected to a point P on the threaded surface of the hole, and this projected point P is associated with the closest element face 610 of the meshed threaded support. This face 610 is bounded by nodes $N_2$, $N_3$, $N_4$ (the nodes $N_2$, $N_3$, $N_4$ being proximate the projected point P). The nodes $N_2$, $N_3$, $N_4$ of the element's face are then linked (by links 612-614) with the node $N_1$ to form an element of the tightening mesh. The process is repeated for all the thread-area nodes of the finer mesh (which, in the present example, is the bolt's mesh) to generate the full mesh of the tightening connection. Of course, if a different polygon representation is used to model the surfaces, then the number of links forming each element of the tightening mesh will differ (e.g., if the surface is modeled by bricks instead of tetrahedrons, then each face will be bounded by four nodes, and each element of the tightening mesh will be formed of four links). Further, although the described implementation forms projections from "all" of the finer mesh nodes, implementations may choose a subset of the nodes (e.g., every other node) or a superset (e.g., every node plus the middle of every face).

Bolt Tightening Connection Property

Figure 6B:
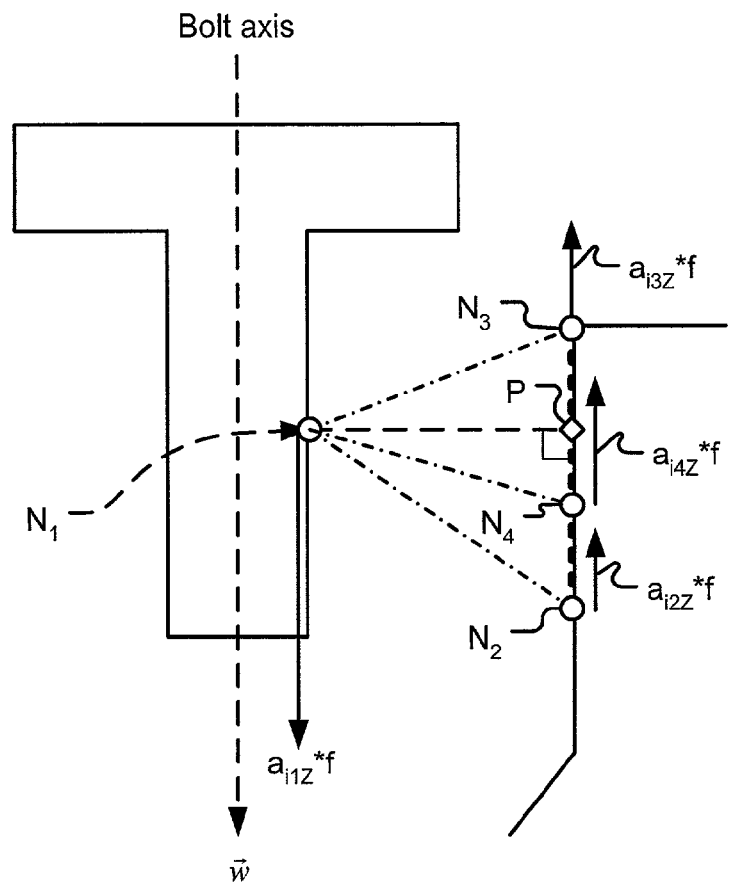

To model bolt tightening induced stresses, (i) an elementary tension force magnitude, and (ii) a normalized orientation vector are associated with each of the connection elements 612-614 (or correspondingly, with their associated nodes $N_1$, $N_2$, $N_3$, $N_4$). The elementary tension force magnitude for each tightening element may be calculated by dividing the total tension force (defined by the user using the bolt tightening tool 207) by the number of tightening elements present in the connection. Thus, for example, if (i) the total tension force is X, and (ii) there are Y elements in the bolt's tightening mesh, then the tension force per tightening element is X/Y. It is noted that, in some cases, orthogonal projections from different nodes on the bolt's mesh may be associated to the same element face 610, therefore linking different bolt nodes to the same element face; in such cases, the distributed force at each node $N_2$, $N_3$, $N_4$, is a sum of the contribution of the different tightening elements (linking a node to this element face. The orientation vector $\vec{w}$ is the same for each tightening element of the connection mesh and is defined to be collinear to the bolt axis and oriented either in the same sense or in the opposite sense. The direction of the orientation vector $\vec{w}$ characterizes the tightening force as either pushing the parts 301-302 together (true tightening action, as shown in FIG. 6) or pulling them apart (as a kind of "jack effect"). Referring to FIG. 6B where the pre-tension force is assumed collinear to the z axis, the contribution of the tightening element to the distributed pre-tension force is shown by "$a_{i1z}*f$", "$a_{i2z}*f$", "$a_{i3z}*f$", "$a_{i4z}*f$", where f is the (elementary) pre-tension force of the $i^{th}$ element and $a_{ijz}$ the coefficient, in the inequality constraint generated by the $i^{th}$ element, relative to the $j^{th}$ node in the z direction. Derivation of this inequality is described later on.

During computation of the bolt tightened assembly, the analysis system can first generate and process several sets of computation constraints ("bolt tightening constraints") that are used to ensure that the bolt has been screwed inside the tapered hole so as to generate the user-prescribed tension between the bolt and the tapered hole. That is, the system computes the final position of the threaded surface of the bolt with respect to the tapered surface of the hole to achieve the prescribed force. Once the relative displacement obtained by applying the prescribed force has been computed, the threaded surface of the bolt and the tapered surface of the hole are considered to be fully fastened. This computation is explained in the following paragraphs.

Equality Constraints

To determine the appropriate bolt depth, an optimization process is used to determine bolt depth based on a set of bolt tightening constraints enforcing a condition whereby the relative displacement, in directions normal to the pre-tension force (i.e. the bolt axis), of each node (e.g., $N_1$ of FIG. 6) on the bolt thread and each corresponding projected point (e.g., P of FIG. 6) on the threaded surface is zero. This can be expressed as two equalities stating that, in two non collinear directions normal to the orientation vector, the translations of the start node $N_1$ on the first surface and the projected point P on the second surface are essentially equal.

Because the projected point P is a conceptual point rather than a true reference, the displacement of point P, $U_P$, may be interpolated based on the displacement of the nodes bounding P's face element. Thus, the displacement of P can be determined by an interpolation based on the shape functions of the face of the elastic element on which the projection has landed. More particularly, if the element face is a triangle (N=3) (that corresponds, for instance, to the face of a tetrahedron element), the element face has three nodes $N_2$, $N_3$, $N_4$ with corresponding displacements $U_2$, $U_3$, $U_4$, and C is the interpolation function, then:

$$U_p = C \begin{bmatrix} U_2 \\ U_3 \\ U_4 \end{bmatrix}, \text{ where } U_i = \begin{bmatrix} T_{ix} \\ T_{iy} \\ T_{iz} \end{bmatrix},$$

$T_{i\alpha}$ the translation of node i in direction $\alpha$

This function may be expanded as:

$$U_p = \begin{bmatrix} C_{2x}T_{2x} + C_{3x}T_{3x} + C_{4x}T_{4x} \\ C_{2y}T_{2y} + C_{3y}T_{3y} + C_{4y}T_{4y} \\ C_{2z}T_{2z} + C_{3z}T_{3z} + C_{4z}T_{4z} \end{bmatrix}.$$

Shape functions are required to have the following property:

$$\sum_{i=2}^{4} C_{i\alpha} = 1, \text{ for } \alpha = x, y, z$$

This property is verified when shape functions are complete, which is the case in most of practical situations (see [ref.2] for more details on the subject). Thus, for each node $N_1$ and projected point P, the two equalities stating that, in two non-collinear directions normal to the orientation vector, the translations of the start node $N_1$ on the first surface and the translation of the projected point P on the second surface are essentially equal, may be expressed as:

$(-U_1 + U_p) \cdot \vec{v} = 0$, and $(-U_1 + U_p) \cdot \vec{u} = 0$, where • represents the scalar product between vectors, and u, v two vectors such that $$\vec{u} = \begin{bmatrix} u_x \\ u_y \\ u_z \end{bmatrix}; \vec{v} = \begin{bmatrix} v_x \\ v_y \\ v_z \end{bmatrix}$$

forms an orthogonal basis with the orientation vector (i.e., the screwing $$\text{direction vector}) \vec{w} = \begin{bmatrix} w_x \\ w_y \\ w_z \end{bmatrix}.$$

Each node's pair of equalities may also be expressed in matrix form: by writing $U_p$ in terms of $U_2$, $U_3$ and $U_4$ in the expression $$\begin{cases} (-U_1 + U_p) \cdot \vec{u} = 0 \\ (-U_1 + U_p) \cdot \vec{v} = 0 \end{cases}$$

to obtain $$\begin{bmatrix} -T_{1x} + C_{2x}T_{2x} + C_{3x}T_{3x} + C_{4x}T_{4x} \\ -T_{1y} + C_{2y}T_{2y} + C_{3y}T_{3y} + C_{4y}T_{4y} \\ -T_{1y} + C_{2z}T_{2z} + C_{3z}T_{3z} + C_{4z}T_{4z} \end{bmatrix}^T \cdot \begin{bmatrix} u_x & v_x \\ u_y & v_y \\ u_z & v_z \end{bmatrix} = (0, 0)$$

which in turn can be written as $$\tilde{A}_{TE} \cdot \begin{bmatrix} U_1 \\ U_2 \\ U_3 \\ U_4 \end{bmatrix} = \begin{bmatrix} 0 \\ 0 \end{bmatrix}$$

where the coefficients of the matrix $\tilde{A}_{TE}$ are described in FIG. 7. By inserting zero terms corresponding to displacements of nodes other than nodes 1 to 4, this two-row matrix represents the contribution of the tightening element to the global equality constraint matrix $A_{TE}$ in the form of two scalar equations. In other words, matrix $A_{TE}$ receives the contribution of all the tightening elements therefore containing twice as many rows as tightening elements. The global equality constraint due to tightening is written as:

$A_{TE}x = 0$, where x is the vector of all the nodal displacements (i.e. the degrees of freedom in the preferred embodiment).

In the FIG. 7 example, $\tilde{A}_{TE}$ is a 2 by 12 matrix (i.e. it consists of two row vectors) which, after padding with zero terms inside (corresponding to displacements of nodes other than nodes 1 to 4), forms the $(2i)^{th}$ and the $(2i+1)^{th}$ rows of the matrix $A_{TE}$ Inequality Constraints Referring again to the tightening element, another (i.e., a third) constraining relation is introduced in the form of an inequality constraint to express the condition that, in the direction of the orientation vector $\vec{w}$, the relative translation of the start node $N_1$ to its projection P is lower than a certain value S that is set by the program. This inequality is expressed as $(-U_1 + U_p) \cdot \vec{w} \leq S$, and, as for the equalities, each such inequality may be expressed in a matrix form:

$$\tilde{A}_{TI} \cdot \begin{bmatrix} U_1 \\ U_2 \\ U_3 \\ U_4 \end{bmatrix} \leq S,$$

where the coefficients of the matrix $\tilde{A}_{TI}$ are described in FIG. 7. By inserting zero terms corresponding to displacements of nodes other than nodes 1 to 4, this one-row matrix represents the contribution of the tightening element to the global inequality constraint matrix $A_{TI}$ in the form of one scalar inequality.

In our FIG. 7 example $\tilde{A}_{TI}$ is a 1 by 12 matrix (i.e. it consist of a single a row vector) which, after padding with zero terms inside (corresponding to displacements of nodes other than nodes one to four), forms the $i^{th}$ row of the matrix $A_{TI}$. Typically, the value of S will equal zero during application of the distributed pre-tension force described above (step 1, below), and will equal the relative translation computed in step 1 during the application of the working loads (step 2, below), so as to enforce the final relative displacement computed in step 1. It must be noticed that, due to the direction of the tension force, this constraint will be naturally verified in step 1, i.e. reaction forces are null, therefore enabling the threaded surface of the bolt and the tapered surface of the hole that are in contact to freely slide along each other in the direction of the bolt axis, whereas in step 2 the enforcement of the constraint will generate reaction forces, i.e. similar to the distributed pre-tension force, therefore preventing any sliding, in the direction of the bolt, of the threaded surface of the bolt with respect to the tapered surface of the hole that is in contact with the latter surface. This justifies the fact that, during step 2, the threaded surface of the bolt and the tapered surface of the hole appear to be fully fastened; indeed the probability in practical cases that the bolt slides further into the hole without application of the distributed pre-tension force is negligible.

Mathematical Optimization Problem.

A solution is then determined using a two-step optimization process described below. Step k calculates the value of $x_k$, (i.e. the values of the degrees of freedom at step k, k=1, 2).

Step 1 and Step 2 are as follows:

Step 1: calculate $x_1$, a solution of P(F=distributed pre-tension force, S=0)

Step 2: calculate $x_2$, a solution of P(F=working loads, $S=A_{TT}x_1$) where P(F, S) is the following optimization problem:

P(F, S)=find x that solves $$\begin{cases} \min g(x; F), x \in \Re^n \\ \text{such that} \begin{cases} \text{general constraints other than tightening} \\ (i.e. \text{ restraints, other connections}) \\ A_{TE}x = 0 \\ A_{TI}x \leq S \end{cases} \end{cases}$$

where $A_{TE}$ and $A_{TE}$ are matrices generated by the tightening elements as described above, g(x; F) is the total potential energy, and $\Re$ is the set of all real numbers. For linear elasticity problems, $$g(x; F) = \frac{1}{2}x^T K x - x^T F,$$

i.e. the sum of the elastic energy and the work of applied loads, where $x^T$ is the transpose of the matrix x, K is the stiffness matrix (stiffness tells what are the elastic forces generated when nodes are displaced and relates to all nodes connected by an elastic element; for more details regarding the use of stiffness values, see, generally, [ref.1] and [ref2]). Note that in step 1, S=0, the inequality constraint is never active, and the bolt can freely slide in the hole, pushed by the distributed force; in step 2, S=A*x1, and we impose at least the same relative slide of the bolt in the hole as found in step 1. Techniques to solve optimization problems are found in the literature, and can be adapted to the optimization problems described herein. For example techniques described in *Linear and Nonlinear Programming* by D. G. Luenberger, Addison Wesley, 1989 [ref. 3] may be adapted for solving the foregoing optimization problems.

Coefficients of the Distributed Pre-Tension Force

The distributed pre-tension force applied on the bolt threaded area calculated in the first step of the calculation has a value totaling the user-prescribed tension force between the threaded bolt and the tapered hole. By virtue of the property of the shape functions mentioned above, the rest of the distributed pre-tension force is applied on the threaded area of the hole and equilibrates the distributed pre-tension force applied on the bolt threaded area. The forces, applied to the assembly in the second step are the working forces.

Each tightening element distributes its tension force according to the coefficients of the inequality constraint it generated (i.e. the row vector that the element generated in the matrix $A_{TI}$). The distributed force generated by the $i^{th}$ tightening element is obtained by scalar multiplication of the $i^{th}$ row vector of $A_{TI}$ so as to represent a force whose nodal component, on the start node of the tightening element, equals the element tension force (in a preferred embodiment as $\vec{w}$ is a normalized vector, this is obtained by multiplying by the elementary tightening force magnitude f). FIG. 6B For example, in FIG. 6B. "$C_{2z}*w_z*f$"="$a_{i2z}*f$" as "$C_{2z}*w_z$"="$a_{i2z}$". Once the solution x is found, a von Mises display may be produced by a post processing procedure.

Virtual Bolt Tightening

Figure 8:
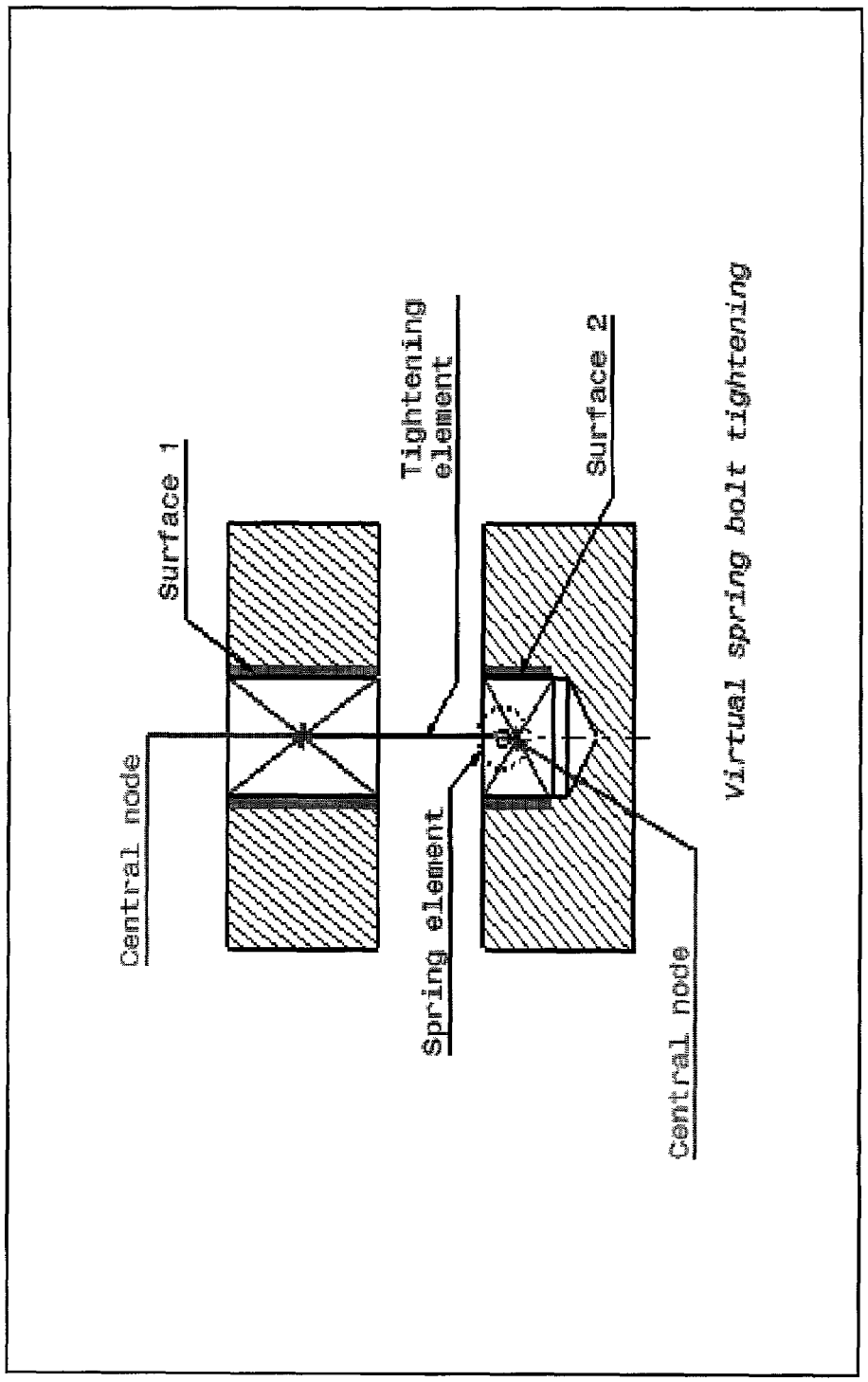
FIG. 8 illustrates virtual bolt tightening

Implementations may include variations of the above-described procedure. For example, in some cases, a user may wish to model stress due to a bolt even before the design of the bolt has been fully modeled. For example, the size of the threaded region may not be fully specified. A user may, nonetheless, like to take into account the influence of the tightened bolt in the calculations of working stress of the object. In order to allow for this possibility, implementations may supports a technique, herein called 'virtual bolt tightening' to model the effects of the bolted connection. This virtual bolt tightening technique may be applied to model a "virtual" bolt (which may be modeled as an infinitely rigid, as well as a bolt of varying degrees of flexibility). Referring to FIG. 8, to model stress effects of this virtual bolt, the user first select the surfaces involved in the connection ("Surface 1" and "Surface 2"). The virtual bolt tightening modeling process models the physical effects of the bolt tension as that tension is transmitted to the support in two areas: (i) the area in contact with the bolt head, and (ii) the area of the tapered hole in contact with the bolt thread. Thus the surfaces involved in the connection should be chosen as close as possible to these areas. These two surfaces may be referenced through a design positioning constraint.

A virtual bolt tightening procedure based on the bolt tightening connection procedure described with reference to the bolt modeled in FIGS. 3 and 6, above, may then be engaged to model the virtual bolt. Depending on how the stiffness (i.e. flexibility) of the virtual bolt is modeled, the user will have to specify additional information, e.g. for a virtual spring bolt tightening connection, the user needs to specify the stiffness of the bolt through a spring property.

Virtual Bolt Tightening Connection Mesh

To analyze bolt tightened assemblies when the bolt model is not present in the assembly, the system generates a particular type of connection mesh referred to herein as a "virtual bolt tightening connection mesh." In the preferred embodiment, this connection mesh consists of at least of three elements: two elements of type "smooth web-like kinematic elements" and one element of type "tightening beam element". The term "web-like" is a analogy drawn from a common spider's web to refer to a structure of nodes interconnected to each other by links. Additional elements other than tightening elements can be added to take into account the flexibility of the virtual bolt (e.g. flexible beams, springs, rigid beams, etc).

The smooth web-like kinematic element is a N-node element where its first node supports translations as well as rotations as degrees of freedom $$\left(i.e.\ U_1 = \begin{bmatrix} T_{1x} \\ T_{1y} \\ T_{1z} \\ R_{1x} \\ R_{1y} \\ R_{1z} \end{bmatrix}\right),$$

whereas nodes 2 to N support only translation $$\left(i.e.\ U_i = \begin{bmatrix} T_{ix} \\ T_{iy} \\ T_{iz} \end{bmatrix},\ \text{for}\ i \geq 2\right),$$

although their average displacement is to be described with a translation and a rotation. This element generates six equality constraints (three in translation and three in rotation) to link the displacement of its first node with the average displacement of the N−1 other nodes.

The tightening beam element is a 2-node element where each node supports translations as well as rotations as degrees of freedom. This element generates five equality constraints (two in translation normal to the tightening direction and three in rotation) to link the displacement of its two nodes and one inequality constraint (in translation along the tightening direction).

The virtual spring bolt connection mesh is produced according the following process:

1. a central node is created at the centroid of each surface of the geometric constraint referenced as the support;
2. two smooth web-like kinematic elements are created to link each central node to the nodes of the corresponding surface
3. a duplicate of the second central node is created;
4. the first central node is linked to the duplicate of the second central node using a tightening beam element and linking the second central node is linked to the duplicate of the second central node through a spring element Virtual Bolt Tightening Connection Property The tightening beam element can have its nodes superposed (i.e. the element has zero length), in which case the element needs a tightening direction in the (preferred) form of a normalized vector $\vec{w}$. If the element is not of zero length, the tightening direction is necessarily collinear to the vector going from its first node to its second node, the user is left with the choice, as in the bolt tightening connection, to push together or to pull apart. The elementary pre-tension force of this element equals the user-prescribed pre-tension force.

Equality Constraints

The tightening beam element generates five scalar equality constraints that impose a rigid body movement between its two nodes except for the translation in the direction of the tightening, where no equality constraint is generated:

$$(-T_1+T_2+\vec{N_1}\vec{N_2}(\times)R_2)\cdot[\vec{u}\ \vec{v}]=0,\ \text{where}\ (\times)\ \text{is the vector product}$$

$$(-R_1+R_2)\cdot[\vec{u}\ \vec{v}\ \vec{w}]=0$$

Each smooth web-like kinematic element generates six scalar equality constraints:

$$(-T_1+T_G+\vec{N_1}\vec{N_G}(\times)R_G)\cdot[\vec{u}\ \vec{v}\ \vec{w}]=0$$

$$(-R_1+R_G)\cdot[\vec{u}\ \vec{v}\ \vec{w}]=0,$$

where $$U_G = \begin{bmatrix} T_{Gx} \\ T_{Gy} \\ T_{Gz} \\ R_{Gx} \\ R_{Gy} \\ R_{Gz} \end{bmatrix}$$

represents the average displacement of nodes 2 to N. The system expresses $U_G$ in terms of the displacement of nodes 2 to N (in a least-squares sense). This expression is not central to the invention and will not be described.

Inequality Constraints

The inequality generated by the tightening beam may be expressed as $(-T_1+T_2)\cdot\vec{w} \leq R$, which may also be expressed in matrix form as:

$$\tilde{A}_{TI} \cdot \begin{bmatrix} U_1 \\ U_2 \end{bmatrix} \leq S,$$

where. $\tilde{A}_{TI} = [\ -w_x\ \ -w_y\ \ -w_z\ \ 0\ \ 0\ \ 0\ \ w_x\ \ w_y\ \ w_z\ \ 0\ \ 0\ \ 0\ ]$ Generic Tightening Computation Procedure Once the equality and inequality constraints generated, the system proceeds as described within the non-virtual bolt tightening section, generating the distributed pre-tension force using the inequality in the first step of the calculation and so on. Note that different types of tightening connections can be present simultaneously in an assembly.

Implementation

The invention may be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application-specific integrated circuits). Although computer aided design (CAD) and computer aided manufacturing (CAM) systems are most prominently described in the foregoing disclosure, the disclosure is not limited to such systems as the disclosed invention may also be implemented as part of, or used in conjunction with, computer aided engineering (CAE), product life management (PLM) systems, and other computerized design systems. In the case of a bolted connection, terms "engaging region" and "receiving region" refer, respectively, to a threaded region on the bolt and to the threaded receiving hole in a part. However, engaging region and receiving region also apply in the context of non-threaded connectors and connections, such as riveted connections, to refer to the areas in which such connectors engage their respective parts. Note that the actual threads in a threaded engaging and receiving region need not be modeled—such regions may, for example, be modeled as smooth regions and data stored with the model may indicate that the regions operate to fasten the bolt and part in a bolted configuration.

A number of embodiments of the present invention have been described. Nevertheless, it will be understood that various modifications may be made without departing from the spirit and scope of the invention. For example, although tightening of a "bolt" was described, the invention may be applied to, and encompasses, stresses created by other types of fasteners (e.g., rivets) that interconnect parts with a pre-tension force. Accordingly, other embodiments are within the scope of the following claims.

What is claimed is:

1. A method of analyzing the mechanical state of an assembly modeled by a computer aided system, the method comprising:
   generating a model of a fastener comprising an engaging region;
   generating a model of a first part of an assembly, the model of the first part comprising a receiving region configured to receive in a fastenable manner the engaging region of the fastener;
   generating a finite element representation of the first part and the fastener, each finite element representation comprising a plurality of elastically interconnected nodes;
   generating a tightening mesh interconnecting nodes of the engaging region and nodes of the receiving region; and
   determining a force applied between the nodes of the engaging and receiving region based on a pre-tension force modeled as occurring upon engaging the engaging region with the receiving region, wherein the force is displayed on the computerized modeling system.

2. The method of claim 1 wherein:
   generating a tightening mesh comprises coupling surface nodes of the engaging region to surface nodes of the receiving region.

3. The method of claim 2 wherein coupling surface nodes comprises:
   designating either the engaging or the receiving regions as a first region, and the other one of the engaging region or the receiving region as a second region;
   for each one of the nodes in the first region,
   forming a projection from each said one of the nodes onto a corresponding point in the second region,
   determining at least one node in the second region proximate said corresponding point, and
   linking the at least one node in the second region to said one of the nodes in the first region.

4. The method of claim 3 where:
   each point in the second region comprises a point on one of a plurality of surface faces of the second region, each such surface face being bounded by a plurality of nodes; and
   linking said one of the nodes in the first region comprises linking said one node in the first region to the plurality of nodes bounding a corresponding one of the surface faces on which said one node is projected.

5. The method of claim 1 wherein:
   the model of the fastener further comprises a shaft connecting a head to the engaging region; and
   the method further comprises:
   generating a model of a second part of the assembly comprising a hole;
   generating a finite element representation of the second part, the finite element representation comprising a plurality of interconnected nodes;
   storing data to enforce a co-axial relationship between an axis of the fastener, an axis of the hole, and an axis of the engaging region.

6. The method of claim 5 wherein the shaft of the fastener is modeled to pass through the hole of the second part and the head of the fastener is modeled to contact a surface of the second part when the engaging region is engaged with the receiving region.

7. The method of claim 6 further comprising:
   determining displacement of nodes of the finite element representation of the first part, the second part, and the fastener based on forces exerted between the first part, the second part, and the fastener and resulting from the modeled pre-tension force.

8. The method of claim 7 further comprising:
   applying a working load to the assembly;
   determining a final displacement of all nodes in the assembly resulting from said applying a working load and taking into account the displacements of nodes previously determined based on the application of the pre-tension force.

9. The method of claim 1 wherein:
   the fastener comprises a bolt;
   the engaging region comprises a threaded region of the bolt; and
   the receiving area comprises a model of a threaded hole configured to receive the threaded region of the bolt.

10. The method of claim 1 wherein determining the force applied between the nodes comprises:
    determining constraints between displacement of nodes of the finite element representation of the first part and displacement of nodes of the finite element representation of the fastener, said force being based on a magnitude of the pre-tension force.

11. The method of claim 10 wherein said pre-tension force comprises an orientation, the constraints between the displacements depending on said orientation.

12. The method of claim 10 further comprising:
receiving a user input of the pre-tension force, said pre-tension force being a user-specified tension value modeling a tightening force applied to the fastener, the user input indicating a magnitude and an orientation of said pre-tension force.

13. The method of claim 1 further comprising
computing a positioning of the fastener with respect to the first part, said position being based on the geometry of the modeled first part, and a second part, and said positioning effecting the pre-tension force between the fastener and the second part.

14. The method of claim 13 wherein computing the positioning comprises applying an optimization algorithm to determine the position of the fastener.

15. The method of claim 1, wherein the force is displayed as a Von Mises representation.

16. A computer-readable storage medium on which are recorded instructions that when executed cause a computer processor to:
construct a data structure to represent a model of a fastener comprising an engaging region;
construct a data structure to represent a model of a first part of an assembly, the model of the first part comprising a receiving region configured to fastenably receive the engaging region of the fastener;
generate a finite element representation of the first part and the fastener, each finite element representation comprising a plurality of elastically interconnected nodes;
generate a tightening mesh interconnecting nodes of the engaging region and nodes of the receiving region;
determine a force applied between the nodes of the engaging and receiving region based on a pre-tension force modeled as occurring upon engaging the engaging region with the receiving region; and
encode the force on the computer-readable storage medium.

17. The computer readable storage medium of claim 16 wherein the instructions, when executed, further cause a computer processor to:
compute a positioning of the fastener with respect to the first part, said positioning being based on the geometry of the modeled first part, and a second part, and said position effecting the pre-tension force between the fastener and the second part; and
determine a displacements of nodes of the finite element representation of the first part and a displacement of nodes of the finite element representation of the fastener based on a magnitude of the pre-tension force exerted between nodes of the engaging region and nodes of the receiving region.

18. The computer-readable storage medium of claim 16, wherein the force is displayed as a Von Mises representation.

* * * * *